(12) United States Patent
Siefering et al.

(10) Patent No.: US 11,707,770 B2
(45) Date of Patent: Jul. 25, 2023

(54) PRESSURE CONTROL STRATEGIES TO PROVIDE UNIFORM TREATMENT STREAMS IN THE MANUFACTURE OF MICROELECTRONIC DEVICES

(71) Applicant: TEL Manufacturing and Engineering of America, Inc., Chaska, MN (US)

(72) Inventors: Kevin Siefering, Excelsior, MN (US); Edward Hanzlik, Shorewood, MN (US)

(73) Assignee: TEL MANUFACTURING AND ENGINEERING OF AMERICA, INC., Chaska, MN (US)

( * ) Notice: Subject to any disclaimer, the term of this patent is extended or adjusted under 35 U.S.C. 154(b) by 0 days.

(21) Appl. No.: 17/592,697

(22) Filed: Feb. 4, 2022

(65) Prior Publication Data

US 2022/0152659 A1 May 19, 2022

Related U.S. Application Data

(62) Division of application No. 16/360,624, filed on Mar. 21, 2019, now Pat. No. 11,241,720.

(Continued)

(51) Int. Cl.
*B08B 3/02* (2006.01)
*B08B 3/10* (2006.01)
(Continued)

(52) U.S. Cl.
CPC .................. *B08B 3/02* (2013.01); *B08B 3/10* (2013.01); *B08B 2203/007* (2013.01);
(Continued)

(58) Field of Classification Search
CPC ......... H01L 21/67109; H01L 21/67017; H01L 21/02041; H01L 21/67051; B08B 3/02;
(Continued)

(56) References Cited

U.S. PATENT DOCUMENTS 5,062,898 A 11/1991 McDermott et al.
5,209,028 A 5/1993 McDermott et al.
(Continued)

FOREIGN PATENT DOCUMENTS

CN 105339183 A 2/2016
DE 69730349 T2 2/2005
(Continued)

OTHER PUBLICATIONS

Lauerhaas et al., "Yield Improvement Using Cryogenic Aerosol for BEOL Defect Removal" ECS Transactions, 11 (2) pp. 33-39 (2007).
(Continued)

*Primary Examiner* — Benjamin L Osterhout
(74) *Attorney, Agent, or Firm* — Kagan Binder, PLLC

(57) ABSTRACT

The present invention provides techniques to more accurately control the process performance of treatments in which microelectronic substrates are treated by pressurized fluids that are sprayed onto the substrates in a vacuum process chamber control strategies are used that adjust mass flow rate responsive to pressure readings in order to hold the pressure of a pressurized feed constant. In these embodiments, the mass flow rate will tend to vary in order to maintain pressure uniformity.

22 Claims, 5 Drawing Sheets

Related U.S. Application Data

(60) Provisional application No. 62/646,485, filed on Mar. 22, 2018.

(51) Int. Cl.
  *H01L 21/67* (2006.01)
  *H01L 21/02* (2006.01)

(52) U.S. Cl.
  CPC . *B08B 2203/0229* (2013.01); *H01L 21/02041* (2013.01); *H01L 21/67051* (2013.01)

(58) Field of Classification Search
  CPC ................ B08B 3/10; B08B 2203/007; B08B 2203/0229
  See application file for complete search history.

(56) References Cited

U.S. PATENT DOCUMENTS

| | | | |
|---|---|---|---|
| 5,224,265 | A | 7/1993 | Dux et al. |
| 5,294,261 | A | 3/1994 | McDermott et al. |
| 5,304,796 | A | 4/1994 | Siefering et al. |
| 5,373,701 | A | 12/1994 | Siefering et al. |
| 5,810,942 | A | 9/1998 | Narayanswami et al. |
| 5,942,037 | A | 8/1999 | Wagener et al. |
| 6,125,025 | A | 9/2000 | Howald et al. |
| 6,221,781 | B1 | 4/2001 | Siefering et al. |
| 6,284,006 | B1 | 9/2001 | Siefering et al. |
| 6,845,779 | B2 | 1/2005 | Herbst et al. |
| 7,025,831 | B1 | 4/2006 | Butterbaugh et al. |
| 7,312,161 | B2 | 12/2007 | Siefering et al. |
| 9,412,639 | B2 | 8/2016 | Siefering et al. |
| 9,490,138 | B2 | 11/2016 | Siefering et al. |
| 9,738,977 | B1 | 8/2017 | Karim et al. |
| 9,831,107 | B2 | 11/2017 | Siefering et al. |
| 11,241,720 | B2 * | 2/2022 | Siefering .................. B08B 3/02 |
| 2002/0160606 | A1 | 10/2002 | Siefering et al. |
| 2005/0029492 | A1 | 2/2005 | Subawalla et al. |
| 2015/0209818 | A1 | 7/2015 | deVilliers et al. |
| 2016/0111258 | A1 | 4/2016 | Taskar et al. |
| 2019/0291144 | A1 | 9/2019 | Siefering et al. |
| 2020/0043764 | A1 | 2/2020 | Clark et al. |
| 2020/0161124 | A1 | 5/2020 | Siefering |

FOREIGN PATENT DOCUMENTS

| | | |
|---|---|---|
| DE | 60037515 T2 | 9/2009 |
| JP | H0727297 A | 1/1995 |
| KR | 20000036062 A | 6/2000 |
| KR | 20000062322 A | 10/2000 |
| KR | 20050044456 A | 5/2005 |
| KR | 20160085845 A | 7/2016 |
| TW | 1284366 B | 7/2007 |
| WO | 98/10893 A1 | 3/1998 |
| WO | 98/28107 A1 | 7/1998 |
| WO | 01/04935 A2 | 1/2001 |
| WO | 03/043059 A2 | 5/2003 |
| WO | 2015/073517 A1 | 5/2015 |

OTHER PUBLICATIONS

Weygand et al, "Cleaning silicon wafers with an argon/nitrogen cryogenic aerosol process" Micro:Tech Focus—Clean & Green, p. 47 (Apr. 1997), http://www.micromagazine.com/archive/97/04/wegland.html, reviewed Jan. 13, 2004, 11 pages.

Butterbaugh et al., "Enhancing yield through argon/nitrogen cryokinetic aerosol cleaning after via processing" Micro: Surface Chemistries p. 33 (Jun. 1999), http://www.micromagazine.com/archive/99/06/butter.html, reviewed Jan. 13, 2004, 7 pages.

Wagener et al., "What's driving the new momentum behind cryogenic aerosols" Solid State Technology, reprinted with revisions to format, from Jul. 2004 edition, 4 pages.

Wegener et al., "Improved Yields for the Nano-Technology Era Using Cryogenic Aerosols" ASMC 2004 Proceedings—15th Annual Advanced Semiconductor Manufacturing Conference and Workshop May 4-6, Boston, MA, pp. 467-471 (2004).

\* cited by examiner

PRESSURE CONTROL STRATEGIES TO PROVIDE UNIFORM TREATMENT STREAMS IN THE MANUFACTURE OF MICROELECTRONIC DEVICES

PRIORITY

This nonprovisional patent application is a divisional application of U.S. Ser. No. 16/360,624, filed Mar. 21, 2019, titled "Pressure Control Strategies to Provide Uniform Treatment Streams in the Manufacture of Microelectronic Devices" which claims priority to U.S. Provisional Patent Application No. 62/646,485, filed Mar. 22, 2018, titled "Systems and Method for Nano-Aerosol Gas and Pressure Control," the entire disclosures of which are incorporated herein by reference in their respective entireties for all purposes.

FIELD OF THE INVENTION

This disclosure relates to systems and methods for treating the surface of a microelectronic substrate in a vacuum pressure chamber with treatment streams(s), and in particular for removing objects from the microelectronic substrate using pressurized fluid material that is dispensed as one or more fluid streams through one or more nozzles into the chamber and at the substrate, wherein pressure control strategies are used to control pressures of the incoming, pressurized fluid material supplied to the nozzle(s) as well as the vacuum chamber pressure.

BACKGROUND OF THE INVENTION

Many processes used in the manufacturing of microelectronic devices involve positioning one or more microelectronic substrates, e.g., in-process devices at various stages of manufacture, into a sealed chamber. One or more treatment fluids are supplied to one or more nozzles and then dispensed into the chamber to treat the substrate(s) in the desired manner. Often, the fluids are dispensed directly at the substrate surface(s). Exemplary treatments can be used to deposit material, remove material, chemically alter surfaces, physically alter surfaces, rinse surfaces, remove particles or other contaminants or debris from surfaces, and the like.

Treatment processes using one or more treatment streams dispensed through one or more nozzles at the substrate are widely known and used to remove particles and other contamination from substrate surfaces. These treatments generally rely on the energy of fluid streams dispensed at high velocity to dislodge and carry away the contamination. Some of these treatments may also incorporate aspects that chemically alter the surface or the contamination in order to make it easier for the high velocity streams to dislodge and carry away the contamination. In some instances, the streams are derived from pressurized and optionally cooled streams that are dispensed into a vacuum chamber in order to carry out a treatment. Other embodiments may be use pressurized fluids that are heated. Embodiments of these treatments including pressurized and cryogenically cooled feed streams are referred to in the industry as cryogenic cleaning treatments.

TEL FSI, Inc. (Chaska, Minn.) manufactures and markets a series of tool systems under the brand indicia "ANTARES™" that are useful to carry out cryogenic cleaning treatments in the manufacture of microelectronic devices. The tools in the ANTARES™ series are automated, single-wafer, systems useful for processing wafers (including 200 nm or 300 mm wafers). Each system uses cryogenic aerosol technology to safely remove nanoscale particles from workpiece surfaces. Unlike conventional wet technologies, this all-dry process reduces defects and minimizes risks of damaging the wafer surface, even on metal and low-k films. The tools of the ANTARES™ series offer enhanced defect removal and are suitable for treating a wide range of materials.

In a typical cryogenic cleaning treatment, such as exemplary processes used by the tools of the ANTARES™ series, the substrate to be cleaned (e.g. a semiconductor wafer) is typically held in a horizontal orientation on a chuck inside a sealed chamber. The chamber often is under vacuum. At least one expansion nozzle is positioned over the substrate surface during processing. The nozzle(s) include at least one outlet to dispense at least one stream of treatment material at the substrate surface. In many modes of practice, a pressurized and cooled fluid, which may be a mixture of two or more constituents, is supplied to the nozzle. In some modes of practice, the incoming feed desirably is maintained under pressure and temperature conditions that avoid the formation of liquid material in the supply line, as undue liquid formation in the feed could lead to increased contamination risk and or increased risk of damaging sensitive device features. When the pressurized and cooled fluid is dispensed from the nozzle into the lower pressure regime of the chamber, the fluid is converted into energetic, high velocity streams. These streams may include gas jets and/or sprays of gas, gas clusters, liquid droplets, and/or solid particles. The sprays of particles or droplets also are referred to as aerosols. The sprays in some instances may include very finely sized particles that may be sized on a nanoscale, e.g., as having a particle size in the range from 5 nm to 100 nm. Due to the small, potentially nano-scale size of such particles, the resultant spray may be referred to in the industry as a nano-aerosol. These high velocity jets and/or aerosols, including the nano-aerosols, effectively dislodge and remove contaminants such as particles from the surface of the substrate.

FIG. 1 (prior art) shows one example of a typical design for a cleaning system 10 used to carry out cleaning treatments. System 10 includes a housing 12 defining a process vacuum chamber 14. Inside chamber 14, microelectronic substrate 16 is supported on a chuck 18 that may be rotatable and/or translatable. Exhaust pathway 22 is coupled to a suitable vacuum pump (not shown) in order to exhaust materials from the chamber 14. A motorized butterfly throttle valve 24 is used to throttle the flow of exhausted material through the exhaust pathway 22 in order to control the vacuum pressure inside chamber 14. Pressurized and optionally cooled or heated fluid from one or more suitable sources 26 is supplied to the vacuum process chamber 14 through supply line 28. The pressurized fluid is expanded and dispensed into chamber 14 through nozzle 30 to generate a stream 31 to treat the substrate 16.

System 10 includes a control network system 36 in order to control tool operations, including chamber pressure and the mass flow rate of the fluid into the chamber 14. Control network system 36 includes computer 38, throttle valve controller 40, motorized butterfly throttle valve 24, mass flow controller (MFC) 32, pressure transducer 20, and pressure transducer 34. MFC 32 may incorporate a thermal mass flow meter for rapid flow rate monitoring. Control network system 36 also includes network communication lines 42, 44, 46, 48, and 50 interconnecting these components to allow network communications to occur.

To control chamber pressure, pressure transducer 20 senses the pressure inside chamber 14 and sends sensed pressure information to throttle valve controller 40 via communication line 44. Computer 38 sends a chamber pressure set point to throttle valve controller 40 via line 42. Using the chamber pressure setpoint and chamber pressure information provided by pressure transducer 20, controller 40 uses a suitable control algorithm (e.g. PID loop or the like) to determine the error, e.g., difference or ratio, between the sensed chamber pressure and the desired chamber pressure set-point. Based on this error, controller 40 sends a control signal via line 46 that actuates the motorized butterfly throttle valve 24 more open to increase the vacuum conductance and thereby lower the chamber pressure or more closed to reduce the vacuum conductance and increase chamber pressure. Additionally, controller 40 may send process information (e.g., pressure information, throttle settings, and the like) to computer 38 via line 42 for purposes such as archival purposes, to provide process information to an operator interface, for quality control, to monitor the process and trigger alarms and process shutdown if needed, and the like.

To help control the supply of treatment fluid material to the process chamber 14 via supply line 28 and nozzle 30, the supply line 28 is fitted with a mass flow controller ("MFC") 32 to monitor and control the flow rate of material through supply line 28. Computer 38 sends a flow rate set point to the MFC 32 via line 48. The MFC 32 includes a sensor that senses the flow rate of the fluid and a control valve that controls the flow rate. MFC 32 also includes suitable electronics and programming to use a suitable control algorithm (e.g. PID loop or the like) to determine the error, e.g., difference or ratio, between the sensed flow rate and the desired flow rate setpoint. Based on this error and to more closely match the flow rate to the desired setpoint, MFC 32 sends a control signal that actuates the MFC valve more open to increase the flow rate or more closed to reduce the flow rate. The fluid exiting the MFC 32 then flows into the vacuum chamber 14 through nozzle 30. The pressure of the feed may vary as control is implemented to hold the mass flow rate constant. Additionally, MFC 32 may send process information (e.g., sensed flow rate, control valve position, and the like) to computer 38 via line 48 for purposes such as archival purposes, to provide process information to an operator interface, for quality control, to monitor the process and trigger alarms and process shutdown if needed, and the like.

Supply line 28 also is fitted with a pressure transducer 34 to monitor the pressure of the fluid flow fed from the source(s) 26 to the mass flow controller 32. In this set-up, pressure readings from pressure transducer 34 are not included in a control loop associated with flow rate monitoring and control by the MFC 32.

FIG. 2 (prior art) shows a design modification of system 10. This design modification is implemented in the ANTARES systems commercially available from TEL FSI, Chaska, Minn. The commercially available systems are useful to carry out cryogenic cleaning treatments using treatment streams such as aerosol sprays including gas clusters.

In comparison to the embodiment shown in FIG. 1, system 10 in FIG. 2 is modified to further include a cooling device 52 and additional pressure transducer 54 fitted onto supply line 28 between MFC 32 and the cooling device 52. Additionally, network communication line 56 connects the additional pressure transducer 54 to computer 38. System 10 of FIG. 2 uses the same strategies to control chamber pressure and feed flow rate as used with respect to system 10 in FIG. 1. In a similar fashion to system 10 in FIG. 1, the modified system 10 of FIG. 2 also allows the pressure of the feed to vary as control is implemented to hold the flow rate constant. The pressure information acquired by sensor 54 are not integrated into this flow rate control loop.

In one embodiment the cooling device 52 is a Dewar flask containing a coil through which the fluid material flows. The flask houses liquid nitrogen outside the coil that is in thermal contact with the coils in a manner effective to cool the material flowing through the coil to cryogenic temperatures. The pressurized and cooled gas exiting the coil of the Dewar flask is then directed through the expansion nozzle 30 into the processing chamber 14 to provide treatment stream 31. The expansion nozzle 30 of FIG. 2 includes an orifice that restricts the flow rate of fluid, e.g., gas, through nozzle 30. This backs up pressure on the inlet side of the orifice.

System 10 as configured in FIG. 1 or 2 rely upon flow rate monitoring and control to supply a pressurized and cooled fluid feed to the nozzle 30. The pressure of the feed is allowed to vary as flow rate is controlled. Even when the flow rate is accurately monitored and controlled, variations in the feed supply may still occur that can impact process uniformity within a treatment for a particular workpiece or among treatments for multiple workpieces. In other words, even though flow rate is accurately controlled, process performance and results may still be less uniform than might be desired as a function of time.

Chamber matching among different process chambers also is a concern. Some tools may incorporate multiple process chambers, and multiple tools may be used to handle fabrication at one or more different facilities. Chamber matching refers to the goal to carry out consistent, uniform treatments from chamber to chamber and tool to tool. Chamber matching can be difficult to achieve in practice, as it can be challenging to machine different chambers and tools exactly the same. As microelectronic device features become smaller and smaller, and even if tools used to make these products are manufactured with great accuracy, there is still a variation in tool features that can impact the ability to chamber match accurately. Secondly, there also may be a variation in how a system is assembled, and this variation also can impact uniformity among tools and different process chambers. For example, the plumbing variations between a flow control device such as an MFC and a nozzle associated with the flow control device can cause corresponding variations in the resultant conductance or pressure drop at a given flow rate.

Accordingly, techniques to more accurately control the process performance of treatment systems such as those shown in FIGS. 1 and 2 are desired. Techniques to achieve chamber matching also are desired.

SUMMARY OF THE INVENTION

The present invention provides techniques to more accurately control the process performance of treatments in which microelectronic substrates are treated by pressurized fluids that are dispensed onto one or more substrate(s) in a vacuum process chamber. In the practice of the present invention, it has been discovered that control strategies that read and control pressure features of a treatment system provide a more accurate way to control the uniformity of process performance as compared to methods that attempt to achieve uniformity by holding mass flow rate of a feed supply constant. For example, referring to the previously known systems of FIGS. 1 and 2, it has been discovered that relatively minor variations in the pressure measured at pressure transducer 54 (e.g. a 1 psi variation in a 20 psig pressure) have been shown to significantly change process performance. Consequently, in treatment systems such as these in which the pressure on the inlet side of a nozzle is significantly higher than the pressure within the process chamber, controlling these pressures as well as the difference between these pressures would be more important to provide uniform process performance than simply maintaining a constant mass flow rate in which pressure could vary significantly.

In representative embodiments of the present invention, therefore, control strategies are used that adjust mass flow rate responsive to pressure readings in order to hold the pressure of a pressurized and cooled feed constant. In these embodiments, the mass flow rate will tend to vary in order to achieve and maintain pressure uniformity over time and from chamber to chamber. This is contrasted to prior control strategies in which mass flow rate is controlled to be constant, allowing the pressure to vary. Also, the pressure uniformity achieves better chamber matching.

The present invention also is based at least in part upon an appreciation that the performance of a cryogenic cleaning treatment is very dependent on the pressure of the pressurized and cooled fluid, e.g., a pressurized and cooled gas, supplied to the nozzle as well as the pressure in the interior of the vacuum chamber. The pressures themselves as well as the pressure differential associated with the expansion of the fluid from the higher pressure regime (associated with the fluid entering the nozzle(s)) to the lower pressure regime (associated with the lower vacuum pressure inside the process chamber) greatly influences the cluster formation, velocity, and flow dynamics that all effect cleaning efficiency and damage to sensitive structures on the substrate. Precise control of these pressures and the pressure differential as provided by the present invention are important to optimal and repeatable performance during a treatment of a workpiece as well as among treatments of different workpieces.

The present invention also would help to make chamber matching easier. The pressure control strategies of the invention help to accommodate the impact of hardware variation among different process chambers within a tool and from tool to tool. A significant advantage, therefore, is that the present invention allows tools to be machined with less concern over machine variation while still getting excellent chamber matching. In other words, the present invention uses pressure control strategies to boost chamber matching to a level beyond what might be possible with accurate machining expertise alone. The pressure control strategies also help accommodate variations such as flow conductance or pressure drop in order to help improve chamber matching.

In one aspect, the present invention relates to a method of treating a substrate, comprising the steps of:
a) providing a microelectronic substrate in a vacuum process chamber, wherein the vacuum process chamber has a controlled vacuum pressure;
b) supplying an incoming pressurized fluid to a flow restriction device,
c) using the flow restriction device to spray the incoming pressurized fluid into the vacuum process chamber such that the spray impacts the microelectronic substrate; and
d) adjusting the flow rate of the incoming pressurized fluid in a manner effecting to maintain the incoming pressurized fluid as supplied to the flow restriction device at a controlled pressure.

In another aspect, the present invention relates to a method of treating a substrate, comprising the steps of:
a) providing a microelectronic substrate in a vacuum process chamber, wherein the vacuum process chamber has a controlled vacuum pressure;
b) supplying an incoming pressurized fluid to a flow restriction device,
c) using the flow restriction device to spray the incoming pressurized fluid into the vacuum process chamber as a spray such that the spray impacts the microelectronic substrate;
d) providing a pressure signal that is indicative of an incoming pressure of the incoming, pressurized fluid supplied to the flow restriction device;
e) providing a setpoint pressure signal indicative of a desired incoming pressure of the incoming pressurized fluid supplied to the flow restriction device;
f) determining a control signal based at least in part on a comparison of the incoming pressure signal and the setpoint pressure signal, said control signal being an indication of a difference between the incoming pressure signal and the setpoint pressure signal; and
g) adjusting the flow rate of the incoming pressurized fluid to help control the pressurized incoming fluid at the desired setpoint pressure.

In another aspect, the present invention relates to a apparatus, comprising:
a) a sub-atmospheric process chamber comprising an interior volume having a chamber vacuum pressure;
b) a substrate chuck disposed within the interior volume; and
c) a fluid supply line that delivers a fluid to the interior volume at a controllable flow rate and a controllable pressure, the fluid supply line comprising:
 i) a flow control device that controls the flow rate of the fluid through the supply line; and
 ii) a flow restriction device through which the fluid is dispensed into the process chamber from the supply line; and
 iii) a pressure transducer that measures the controllable pressure of the fluid in the supply line;
d) a vacuum pump coupled to the process chamber in a manner effective to control the chamber vacuum pressure; and
e) a control system coupled to the flow restriction device and the pressure transducer in a manner effect to adjust the flow rate of the fluid in the supply line as a function of pressure readings obtained by the pressure transducer in order to control the pressure of the fluid in the supply line at a desired pressure setpoint.

DETAILED DESCRIPTION OF PRESENTLY PREFERRED EMBODIMENTS

Methods for selectively removing objects from a microelectronic substrate are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the disclosure. Similarly, for purposes of explanation, specific numbers, materials, and configurations are set forth to provide a thorough understanding of the systems and method. Nevertheless, the systems and methods may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic substrate" or "substrate" or "workpiece" as used herein generically refers to the object being processed in accordance with the invention. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, the substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In addition to microelectronic substrates, the techniques described herein may also be used to clean reticle substrates that may be used to patterning of microelectronic substrates using photolithography techniques.

Figure 1:
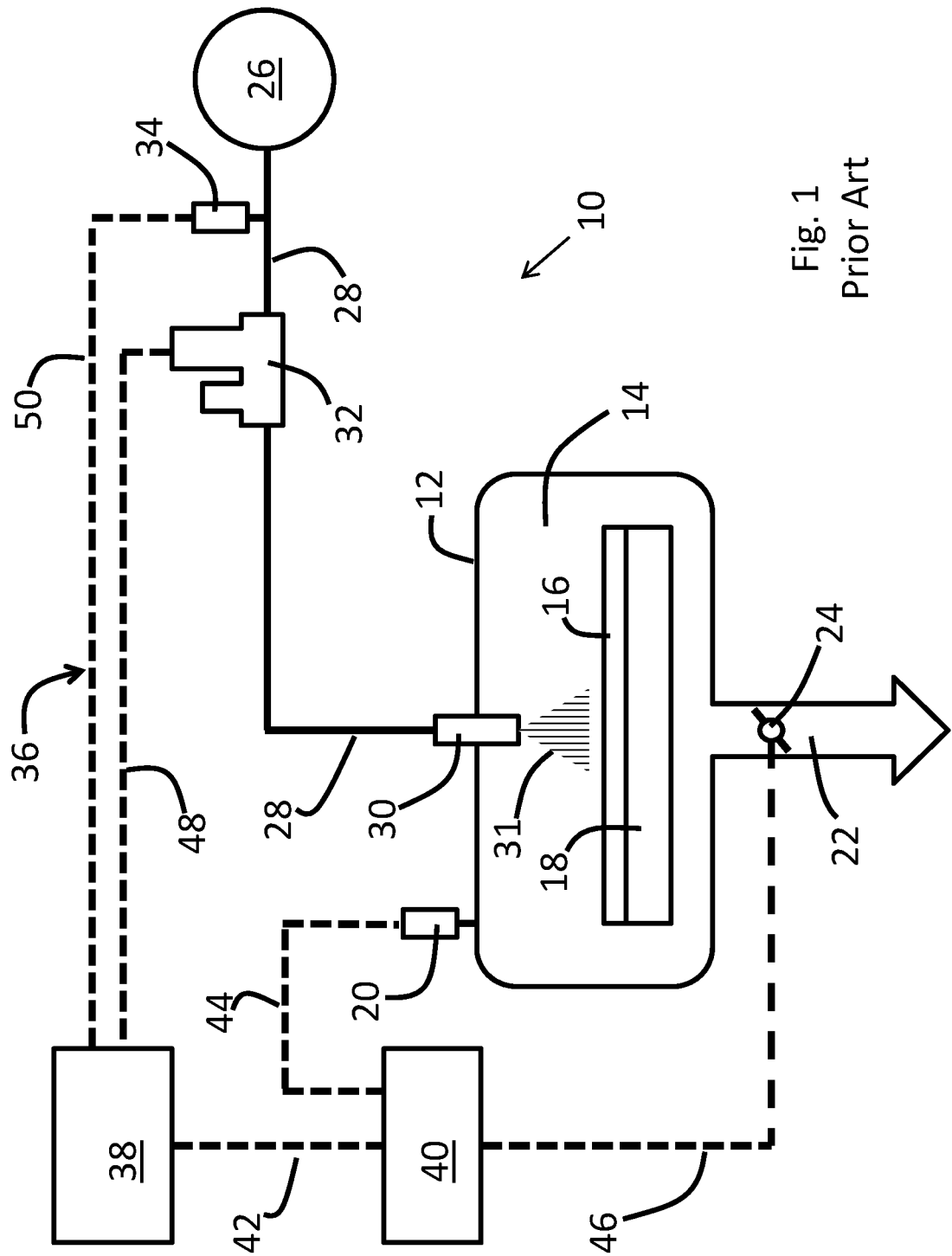
FIG. 1 (prior art) schematically shows a treatment system of the prior art incorporating a conventional control system to control the characteristics of the pressurized and cooled fluid supplied to a treatment carried out in a vacuum process chamber.
Figure 2:
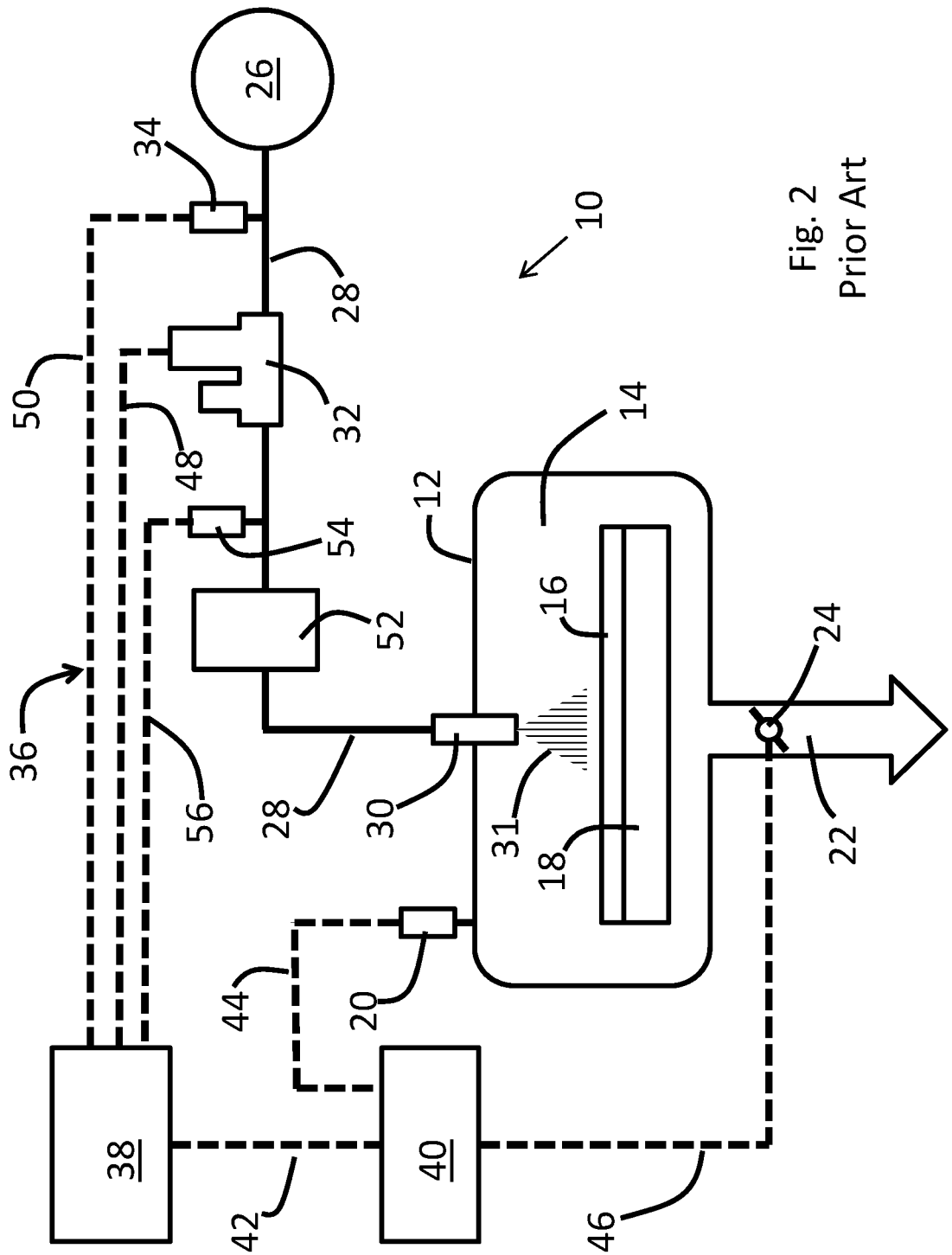
FIG. 2 (prior art) schematically shows a modification of the treatment system of FIG. 1 in which the control system incorporates additional features to control the characteristics of the pressurized and cooled fluid supplied to a treatment carried out in a vacuum process chamber.
Figure 3:
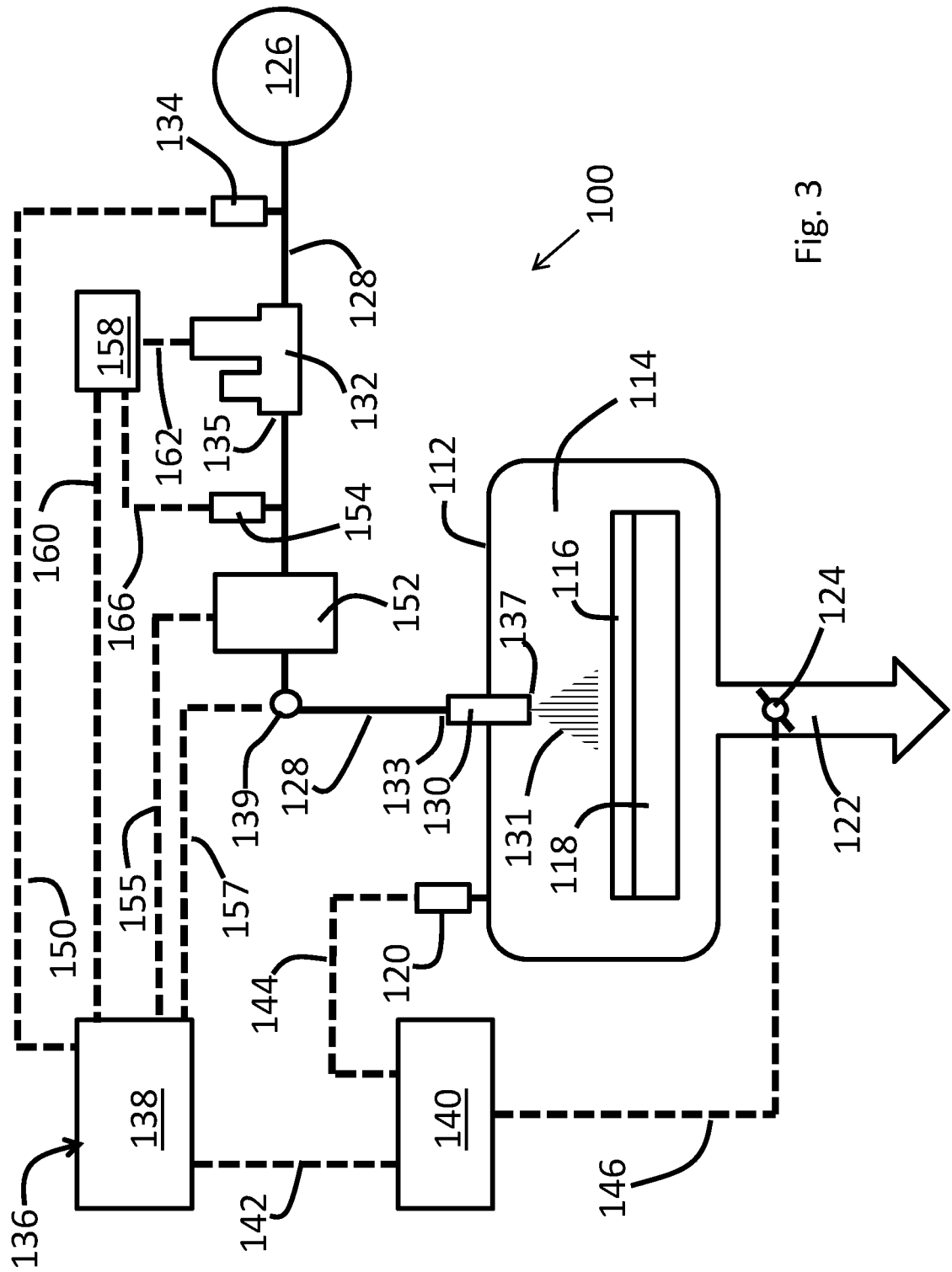
FIG. 3 schematically shows a treatment system incorporating pressure control strategies in accordance with the present invention.

In some embodiments, the present invention provides improved features and/or improved modes of practicing the systems 10 of FIGS. 1 and 2. For example, FIG. 3 shows one example of such a treatment system 100 useful to carry out cryogenic cleaning treatments, wherein the system incorporates pressure control strategies of the present invention. From one perspective, system 100 is an improved version of system 10 of FIG. 2, wherein system 100 incorporates an additional control component in the form of flow set-point controller 158 and corresponding network communication lines 160 and 162. As illustrated, controller 158 is shown as a separate control component relative to computer 138, but controller 158 could also be incorporated into computer 138 and/or flow control device 132, if desired.

In use, and as described in more detail below, these additional components 158, 160, and 162 and their additional functionalities provide strategies by which pressure readings are used to adjust flow rate using a dynamic flow rate set point in order to hold a feed pressure at a desired pressure setpoint. In practical effect, the control strategy implemented in FIG. 3 is a nested control loop strategy in which pressure is controlled in an outer control loop, and flow rate is controlled in an inner control loop.

In more detail, system 100 includes housing 112 defining a vacuum process chamber 114. Inside chamber 114, a microelectronic substrate 116 is supported on a chuck 118, which may be rotatable and/or translatable. Exhaust pathway 122 is coupled to a suitable vacuum system (not shown) in order to exhaust materials from the chamber 114. A suitable flow control valve such as a motorized butterfly throttle valve 124 is used to throttle the flow of exhausted material through the exhaust pathway 122, thus helping to control the pressure inside chamber 114. The motorized butterfly throttle valve 124 may be actuated to choke or open the exhaust pathway 122. Generally, setting the valve 124 to be more closed tends to reduce the vacuum conductance pulling material from the chamber 114. This tends to increase chamber pressure. Setting the valve 124 to be more open tends to increase the vacuum conductance pulling material from the chamber 114. This tends to lower chamber pressure. Hence, monitoring chamber pressure and using a suitable control algorithm to adjust valve 124 based on those pressure readings and the desired chamber pressure set point can be used to help maintain chamber pressure at the desired set point.

The vacuum system and corresponding control components may be configured and actuated to maintain the vacuum process chamber 114 at a pressure that may be less than 35 Torr, or more preferably less than 20 Torr. Such low chamber pressures enhance the formation of fluid streams of gas, gas clusters, liquid droplets, and/or solid particles when the pressurized and cooled material is dispensed into the low pressure process chamber 114 through one or more fluid restriction devices such as nozzle 130. Pressure transducer 120 senses the pressure of process chamber 114.

The nozzle 130 includes an inlet 133 that receives the pressurized and optionally cooled fluid from supply line 128. Nozzle 130 includes outlet 137 through which the fluid is dispensed as one or more stream(s) 131 into chamber 114. In some embodiments, the inlet 133 may have a diameter in the range from about 0.1 mm to about 4 mm. Outlet 137 may have an outlet diameter in the range from 0.1 mm to 6 mm. Often, outlet 137 is larger in diameter than inlet 133. In some instances, nozzle 130 incorporates a constriction orifice (i.e., the narrowest portion of the flow pathway) between inlet 133 and outlet 137. The throat diameter of the constriction orifice desirably is smaller than the inlet or outlet diameters. In some embodiments, for example, the throat diameter provides an orifice that has about 85% to 95% of the cross-sectional area of the nozzle inlet 133. In other instances, inlet 133 serves as a constriction orifice such that the inlet 133 is 85% to 95% of the cross-sectional area of the nozzle region adjacent to the inside of the inlet 133.

As illustrated, system 100 includes a single nozzle 130. However, system 130 may include two or more nozzles.

These may be incorporated into the same spray bar or provided by two or more independent nozzle components that independently dispense material into the chamber 114.

Pressurized fluid from one or more suitable sources 126 is optionally cooled and supplied to the nozzle 130 through supply line 128. As used herein, "fluid" means a flowable material including one or more different kinds of constituents. Hence, a fluid may be formed from a single ingredient such as only argon or only nitrogen. Fluids also include fluid mixtures that may include two or more constituents, such as a combination of argon and nitrogen. Such fluids may be gases, solids, and/or liquids. Preferably, the fluids comprise at least one gas. Examples of suitable gases or liquids include one or more of nitrogen, argon, He, hydrogen, Xe, $CO_2$, neon, krypton, combinations of these, and the like.

Cryogenic fluid cleaning is a technique used to dislodge contaminants by imparting sufficient energy from gas, gas clusters, liquid droplets, or solid particles in a fluid stream, e.g., aerosol particles or gas jet particles (e.g., gas clusters), to overcome the adhesive forces between the contaminants and the microelectronic substrate. Hence, producing or expanding cryogenic fluid to form a spray comprising particles of the right size and velocity may be desirable. In order to influence the velocity of a fluid stream, a carrier gas can be incorporated into the resultant fluid mixture to enhance the cleaning of the contaminants on the substrate. Use of a carrier gas helps to increase the velocity of the resultant fluid spray and facilitates expansion of the dispensed fluid into the chamber 114. This technique satisfies a growing need in the semiconductor industry to enhance cleaning of substrates with small contaminates that traditional aerosol techniques are limited due to insufficient kinetic energy. Examples of suitable carrier gases include nitrogen, hydrogen, helium, neon, combinations of these, and the like.

In one embodiment, the pressurized fluid is argon. In another embodiment, the pressurized and optionally cooled fluid is nitrogen. In another embodiment, the pressurized and cooled fluid comprises argon in admixture with nitrogen at a molar ratio of argon to nitrogen in the range from 1:100 to 100:1, preferably 1:20 to 20:1, more preferably 1:10 to 10:1. In another embodiment, the pressurized fluid is $CO_2$. In another embodiment, the pressurized fluid is $CO_2$ in admixture with nitrogen at a molar ratio of $CO_2$ to nitrogen in the range from 1:100 to 100:1, preferably 1:20 to 20:1, more preferably 1:10 to 10:1. In those embodiments comprising nitrogen, $CO_2$, and/or argon, the fluid may further comprise one or more additional gases or liquids as well. In one embodiment, the additional gas or liquids comprise helium, hydrogen, neon, or a combination of these wherein the molar ratio of the total amount of the additional gas(es) to the argon, carbon dioxide and/or nitrogen is in the range from 1:100 to 100:1, 1:20 to 20:1; preferably 1:1 to 10:1. In another embodiment, the pressurized fluid is $CO_2$ and at least one of hydrogen and/or helium, wherein the molar ratio of $CO_2$ to the total amount of hydrogen and/or helium is in the range from 1:100 to 100:1, preferably 1:20 to 20:1, more preferably 1:10 to 10:1. In those embodiments including hydrogen and helium, the molar ratio of hydrogen to helium desirably is in the range from 1:100 to 100:1, preferably 1:20 to 20:1, more preferably 1:10 to 10:1. In those embodiments including neon and at least one of hydrogen and helium, the molar ratio of neon to the total amount of hydrogen and helium is in the range from 1:100 to 100:1, preferably 1:20 to 20:1, more preferably 1:10 to 10:1.

Specific mixtures include argon and helium; argon and hydrogen; argon, hydrogen, and helium; nitrogen and helium; nitrogen and hydrogen; nitrogen, hydrogen, and helium; carbon dioxide and helium; carbon dioxide and hydrogen; carbon dioxide and nitrogen; carbon dioxide, hydrogen, and helium; argon and neon; argon, neon and hydrogen; nitrogen and neon; nitrogen, neon, and hydrogen; carbon dioxide and neon; and carbon dioxide, neon, and hydrogen.

In a preferred aspect, the treatment fluid material is used by system 100 in a manner effective to balance particle removal efficiency against a risk of damaging sensitive structures on the substrate 116. For example, one aspect of addressing this balance can be achieved by controlling the phase characteristics of a fluid such as argon that is fed to the nozzle 130 and how close the supplied material is to its dew point. It is desirable, for instance, that the pressurized fluid in supply line 128 is maintained at pressures and temperatures so that substantially all of the pressurized fluid in supply line 128 is in the gas phase as supplied to nozzle 130, avoiding condensation. Liquid formation in the supply line 128 can increase the risk of damaging sensitive features on substrate 116 due to the potential size and mass of liquid droplets energetically dispensed into the chamber 114. Liquid condensation in supply line 128 also may increase the risk of substrate contamination. Therefore, it is desirable to supply the pressurized fluid in the gas phase while avoiding reaching or crossing the dew point of the gas. A phase diagram of the fluid being used can help to select appropriate pressures and temperatures to help ensure that the pressurized fluid is in the gas phase while avoiding formation of a liquid phase.

It has been determined empirically that the aggressiveness of cleaning can be controlled based on how close the pressurized fluid is to its dew point. Generally, more aggressive cleaning results when the fluid is closer to the dew point at a given pressure. For more aggressive cleaning, the pressurized fluid is a gas and may be at a temperature that is in a range from about 1 K to about 3 K from the dew point at a given pressure. Less aggressive cleaning may be practiced when the pressurized fluid is a gas and may be at a temperature that is in the range from about 3 K to about 10 K from the dew point at a given pressure. However, treatment fluids can be further away from the dew point and still form treatment streams to provide good cleaning performance.

Without wishing to be bound by theory, a possible rationale to explain this behavior can be suggested. Schematically, the tendency of a gas such as argon to condense or form gas clusters can be viewed as a function of how strongly the individual molecules or atoms want to associate to form a liquid or gas cluster. The material can be viewed as being more "sticky" when this tendency is relatively stronger. While avoiding reaching or crossing the dew point boundary into the liquid regime, a gas generally becomes "stickier" by approaching but not reaching its dew point. It is believed, therefore, that the gas tends to form larger gas clusters closer to the dew point in the gas regime and smaller gas clusters, if any, at a greater distance from the dew point in the gas regime. It is further believed that a gas closer to its dew point provides more aggressive cleaning because such a gas forms larger gas clusters.

Another important aspect of the present invention is to appreciate that monitoring and maintaining the uniformity of the feed pressure in supply line 128 is a key element to achieve consistent and repeatable cleaning performance and better chamber matching. In the practice of the invention, flow rate is controllably adjusted, and therefore varies, to maintain the pressure of the feed supplied to nozzle 130 relative to a pressure set point. At the same time, the chamber pressure is also controlled relative to a corresponding chamber pressure setpoint. The difference between these two pressures, therefore, also is necessarily controlled as a result.

The expansion nozzle 130 of FIG. 3 desirably includes an orifice that restricts the flow rate of fluid through nozzle 130. This backs up pressure on the inlet side of the orifice, so that the pressure on the inlet side of the orifice is significantly higher than the pressure within the chamber 114. This difference of pressure across the expansion nozzle 130 is important to achieve desired aerosol formation, velocity and flow dynamics. The pressure control strategies of the present invention allow improved control over these pressures and the difference between them.

System 100 includes a control network 136 in order to control the pressure characteristics of the fluid flowing into the chamber 114. Control network 136 also helps to control the pressure of chamber 114. By accurately controlling these two pressures, the difference between these pressures is also controlled. One result is more consistent process performance and better chamber matching capabilities.

Control network system 136 includes primary controller 138, throttle valve controller 140, motorized butterfly throttle valve 124, flow controlling device 132, flow set-point controller 158, temperature sensor 139, temperature control device 152, pressure transducer 120, pressure transducer 134, and pressure transducer 154. The different components may be hardware or software based. Hardware may be incorporated into a single unit or deployed at multiple locations.

Control network system 136 also includes communication links interconnecting these components to allow network communications to occur. Communication links include lines 142, 150, and 160 interconnecting primary controller 138 with throttle valve 140, pressure transducer 134 and flow set-point controller 158, respectively. Additional communication links include lines 144 and 146 between throttle valve controller 140 and pressure transducer 120 and motorized butterfly throttle valve 124, respectively. Additional communication links include line 166 between pressure transducer 154 and flow setpoint controller 158 and line 162 between flow setpoint controller 158 and flow controlling device 132. Additionally, primary controller 138 is coupled to temperature sensor 139 and temperature control device 152 by lines 155 and 157. The communication links may be wired or wireless.

Controller 138 may be configured to help control or assist multiple system functions. Controller 138 may include a memory and processor to store and implement process recipes, communications, quality control, system monitoring, flow rates, pressures, temperatures, command structures, user interfaces, real time process information, historical process information, feed supply, feed composition, temperature control, pressure control, heating control, chuck levitation and rotation, chuck translation, substrate loading and unloading, substrate securement on the chuck 118, process control feedback, and the like. Consequently, it can be appreciated that the controller 138 may include the process condition set points for the pressures and temperatures to apply the control strategies of the present invention during cleaning treatments. Similarly, controller 138 can include user-selectable time and recipe details for these treatments.

Beneficially, the functions and capabilities of controller 138 help to control and/or maintain the quality or certain characteristics of the gas cluster and other dispensed streams to improve process consistency within a run, run-to-run in a tool, and tool-to-tool. For example, the gas cluster spray characteristics may be influenced by the supply line dimensions, supply temperature, supply pressure, chamber pressure, supply composition, and substrate temperature. The control techniques or algorithms would control such variables to favorably impact stability, responsiveness, and impact on particle removal efficiency when generating the sprays.

The temperature control system 152 is installed on supply line 128 between mass flow controller (MFC) 132 and nozzle 130 to allow the temperature of the fluid feed to be regulated in a desired manner such as to maintain a desired temperature or temperature profile. In some embodiments, temperature control system 152 includes a heater that may heat the flowing fluid to a suitable temperature above ambient temperature such as a temperature in the range from 300K to 350K, preferably 300K to 325K. The heater in some embodiments may include any electrical and/or other heating functionality to heat fluid feed flowing in supply line 128 to a desired temperature or temperature profile. In an illustrative embodiment, the heater may include a resistive heating element that is thermally coupled to the supply line 128. The temperature of the flowing fluid may be adjusted by adjusting the electrical power fed to the resistive heating element. Often, the electrical power fed to the heating element is controlled by pulse width modulation in which the electrical feed is pulsed on an off at adjustable intervals. Hence, if the fluid temperature is greater than the desired set point, the amount of time that the pulses are off can be increased in order to reduce power and lower the temperature. If the fluid temperature is less than the desired set point, the amount of time that the pulses are on is increased in order to increase power and increase the temperature.

In some embodiments, temperature control system 152 includes a cooling system that allows the flowing feed as supplied to nozzle 130 to be chilled to a suitable temperature below ambient temperature such as a temperature less than 298 K, or even less than 273 K, or even cryogenic temperatures in the range of 77 K to 270 K, or even in the range from 77 K to 150K, or even in the range from 90K to 110K. In some embodiments, temperature control system 152 includes both heating and chilling capabilities.

In one embodiment, the temperature control system 152 includes chilling functionality in the form of a Dewar flask containing a coil through which the fluid material flows. The flask also houses liquid nitrogen outside the coil that is in thermal contact with the coils in a manner effective to cool the material flowing through the coil to cryogenic temperatures such as temperatures in the range from 77 K to 150K, or even in the range from 90K to 110K. This allows a cooled and pressurized fluid feed to be supplied to nozzle 130.

Temperature of material leaving the temperature control system 152 via supply line 128 may be monitored by temperature sensor 139. The temperature readings may be used with a suitable control algorithm to adjust heating or chilling based on those temperature readings and the desired temperature set point to help maintain chamber the temperature at the desired set point.

The pressurized fluid exiting the temperature control system 152 is directed via supply line 128 through the nozzle 130 into the processing chamber 114 to provide at least one treatment stream 131. Treatment stream 131 impacts substrate 116 and thereby helps to remove particles and other contamination from the surface of the substrate 116. Stream 131 may be a gas stream or an aerosol containing gas clusters, liquid droplets, or solid particles. In illustrative embodiments, the fluid streams may include, but are not limited to, cryogenic aerosols and/or gas cluster jet (GCJ) streams that may be formed by the expansion of the fluid from a high pressure environment upstream of nozzle 130 (e.g., greater than atmospheric pressure) to a lower pressure environment (e.g., sub-atmospheric pressure) of the process chamber 114.

Pressure transducer 154 is fitted to supply line 128 in order to take pressure readings from supply line 128 between the flow controlling device 132 and the temperature control device 152. It might be more desirable to take such pressure readings closer to the inlet 133 of the nozzle 130. However, this might not be as practical as might be desired due to the cryogenic temperature and contamination concerns. Consequently, the pressure of the pressurized and cooled gas fed to nozzle 130 is more conveniently measured upstream of cooling device 152 by pressure transducer 154. Because the nozzle 130 incorporates a restriction orifice, the pressure as read at pressure transducer 154 is very indicative of both the pressure within cooling device 152 as well as near the entrance to the nozzle 130. Hence, an advantage of incorporating a restrictive orifice in the nozzle is that the pressure in supply line 128 between the outlet 135 of the flow controlling device 132 and the inlet 133 of nozzle 130 is substantially uniform. The pressure of the fluid as measured by pressure transducer 154 preferably is in the range from 5 psig to 800 psig, preferably 10 psig to 200 psig, more preferably 15 psig to 150 psig.

The flow controlling device 132 may be any suitable device that can be actuated to control the flow rate of material through supply line 128. For instance, the flow control device may be capable of varying the cross-sectional area of a fluid flow pathway to modulate the flow rate through the pathway. In this way, the flow control device may control the amount of fluid (i.e., the volumetric or mass flow rate) and thereby cause corresponding changes in the pressure of the flowing material downstream of the flow control device. For example, increasing flow rate tends to cause a corresponding increase in pressure. Decreasing flow rate tends to reduce the pressure. In this way, flow rate can be adjusted in order to help maintain the flowing material at a desired pressure.

In many embodiments, the flow control device 132 is a mechanical or pneumatic device. Examples of such devices include, but are not limited to, a needle valve, a pinch valve, a diaphragm valve, a variable control valve, a flow control valve, a mass flow controller, a variable electric valve, a variable pneumatic valve, or dome-loaded pressure regulator. For purposes of illustration, FIG. 3 shows flow control device 132 in the form of a mass flow controller (MFC). Accordingly, flow control device 132 shall also be referred to herein as MFC 132. The MFC 132 includes a sensor that senses the flow rate of the fluid and a control valve that controls the flow rate. Sensor readings and valve actuation are used to control the pressure of the fluid feed flowing through supply line 128 in a manner described further below. In illustrative embodiments, the flow rate of fluid material controlled by the flow control device 132 is in the range from 1 slm (Standard Liter per Minute) to 500 slm, even 20 slm to 300 slm.

As an additional capability, the MFC 132 and the cooling device 152 allow the temperature and the pressure of the pressurized and cooled fluid to be independently adjusted in order to help control the phase of the material supplied to nozzle 130 and the characteristics of the resultant spray 131. In illustrative embodiments, the pressure and temperature of the fluid feed supplied to the nozzle 130 may be set to control the liquid and gas content of the feed. For example, the temperature and pressure may be controlled to minimize, prevent, or eliminate as much liquid as is practical from the pressurized feed supplied to the nozzle 130. For example, the fluid pressure may be maintained to cause the pressurized and cooled fluid to be in a gas state as supplied to nozzle 130 and to prevent too much of the feed from being in a liquid state (e.g., no more than 1 weight percent of the gas feed is in a non-gas state) at a corresponding gas temperature. In other embodiments, the pressure and temperature may be selected so that greater amount of the pressurized and cooled feed is in a liquid phase. For example, in some modes of practice, it may be desirable if a feed containing gas and liquid materials includes 10 weight percent or more of liquid material.

The temperature and pressure characteristics used to obtain desired gas and liquid content will depend on the composition of the feed. Generally, phase diagrams of the system can be used to help select suitable temperature and pressure characteristics so that the feed is in the gas phase and above the liquefaction or solidification temperature boundaries of the phase diagram. The phase diagrams also can be used to select pressure and temperatures useful to provide desired liquid content.

An optional pressure transducer 134 also is fitted onto supply line 128 to take pressure readings on supply line 128 between source(s) 126 and the MFC 132. Pressure transducer 134 helps to monitor the pressure of the fluid flow fed from the source(s) 126 to the mass flow controller 132.

An illustrative mode of using pressure control strategies when using system 100 of FIG. 3 will now be described with respect to carrying out a cleaning treatment using argon gas as the treatment fluid. According to this illustrative practice, the controller 138 may direct a substrate handler (not shown) to place the substrate 116 on the chuck 118. Controller 138 adjusts the process conditions within the process chamber 114 and the supply line 128 prior to exposing the substrate 116 to the spray 131. To carry out the cleaning treatment, argon gas is supplied from source 126. The argon gas is supplied to nozzle 130 in cooled and pressurized conditions at 97.5 K and 34.5 psia is fed to nozzle 130 at 160 slm (Standard Liters Per Minute) with a nozzle having a throat plate orifice of 0.092 inches. The argon gas is dispensed into process chamber 114 under conditions effective to form stream 131 incorporating a spray including gas clusters. The gas clusters energetically impact the substrate 116 to help remove contamination from the substrate surface. During the treatment, chuck 118 rotates and translates the substrate 116 relative to the spray 131.

Control strategies of the present invention are used to maintain the chamber pressure, supply pressure of fluid in the supply line 128, and optionally supply temperature of the fluid in the supply line 128 at desired setpoints during the treatment. For example, as the chuck 118 rotates and/or translates the substrate 116 under the nozzle 130, control strategies optionally may be implemented using readings from temperature sensor 139 to control temperature of the pressurized feed supplied to nozzle 130. Sensor 139 sends temperature readings to controller 138 along line 157. Controller 139 uses those temperature readings to determine the temperature error between those readings and a desired temperature setpoint. A suitable control algorithm (such as PID control) is used to generate an appropriate temperature control signal. The temperature control signal is sent to temperature control device 152 along line 155. This actuates the temperature control device 152 to either raise or lower the temperature of the fluid as needed to more closely match the desired temperature setpoint.

Similarly, pressure transducer 120 obtains chamber pressure readings. The chamber pressure readings are sent to controller 140 via line 144. Controller 138 provides controller 140 with a desired chamber pressure setpoint along line 142. For a typical measurement, controller 140 compares a pressure reading to the desired chamber pressure setpoint. Controller 140 determines an error that indicates if the chamber pressure is too high or too low relative to the desired setpoint. Controller 140 may use a suitable control algorithm such as PID control in order to generate a control signal. Controller 140 uses the control signal to correspondingly actuate motorized butterfly throttle valve 124 in order to adjust the chamber pressure to more closely match the desired set point. If the measured chamber pressure is too high, the motorized butterfly throttle valve 124 is actuated to be more open to allow a stronger vacuum conductance through exhaust pathway 122. This lowers the chamber pressure. If the measured chamber pressure is too low, the motorized butterfly throttle valve 124 is actuated to be more closed. This reduces the vacuum conductance through exhaust pathway 122. This increases chamber pressure.

Pressure control strategies of the present invention also guide control of the argon gas pressure fed to the nozzle 130 through supply line 128. As implemented by the system of FIG. 3, this is a nested control loop strategy in which flow rate control is nested inside a pressure control loop. Pressure transducer 154 takes pressure readings of the fluid flowing through supply line 128. Using an analog transducer, the readings may be continuous. A digital sensor may take pressure readings at a suitable sample rate. The pressure readings are transmitted to the controller 158 along line 166. In parallel, controller 138 provides controller 158 with a desired pressure set point along line 160. Controller 158 then compares each pressure reading, or a composite value formed from a group of pressure readings (e.g., controller 158 might compute a composite that is a rolling average of some number, e.g., 3 to 50, of pressure readings which might be consecutive or non-consecutive readings) to the desired pressure set point. Controller 158 uses this comparison to determine an error that indicates if the pressure reading or pressure composite value is too high or too low. Controller 158 may use a suitable control algorithm such as PID control in order to generate a control signal incorporating an updated flow rate set point. Controller 158 sends the control signal to MFC 132 via line 162. The control signal causes the MFC controller incorporated into MFC 132 to update the flow rate set point in a corresponding fashion. Hence, the flow rate set point used by MFC 132 to adjust flow rate is dynamic in the sense that the flow rate setpoint will be adjusted as a function of the pressure reading error over time.

Mass flow controller 132 implements a flow rate control loop using the updated flow rate setpoint. To accomplish this, MFC 132 senses the flow rate of the flowing fluid. MFC 132 compares the measured flow rate to the updated flow rate set point to generate an error that indicates if the measured flow rate is too high or too low. MFC 132 then generates a control signal that is used to adjust the flow rate (which may be an increase or decrease in the flow rate) to more closely match the updated flow rate setpoint. This in turn causes a pressure change so that the measured pressure reading more closely matches the desired pressure set point.

In this nested control strategy, errors in pressure are correlated to desired changes in the flow rate set point, and then the dynamically adjusted flow rate set point guides feedback control of the MFC 132. The strategy allows the flow rate and the flow rate set point to vary in a controlled manner in order to hold the pressure in the supply line 128 constant at the desired pressure set point. The strategy allows improved chamber matching to compensate for variations in tool characteristics associated with different process chambers and different supply lines and nozzles associated with those chambers. In contrast, previous techniques have tried to maintain a constant flow rate while allowing pressure excursions.

Figure 4:
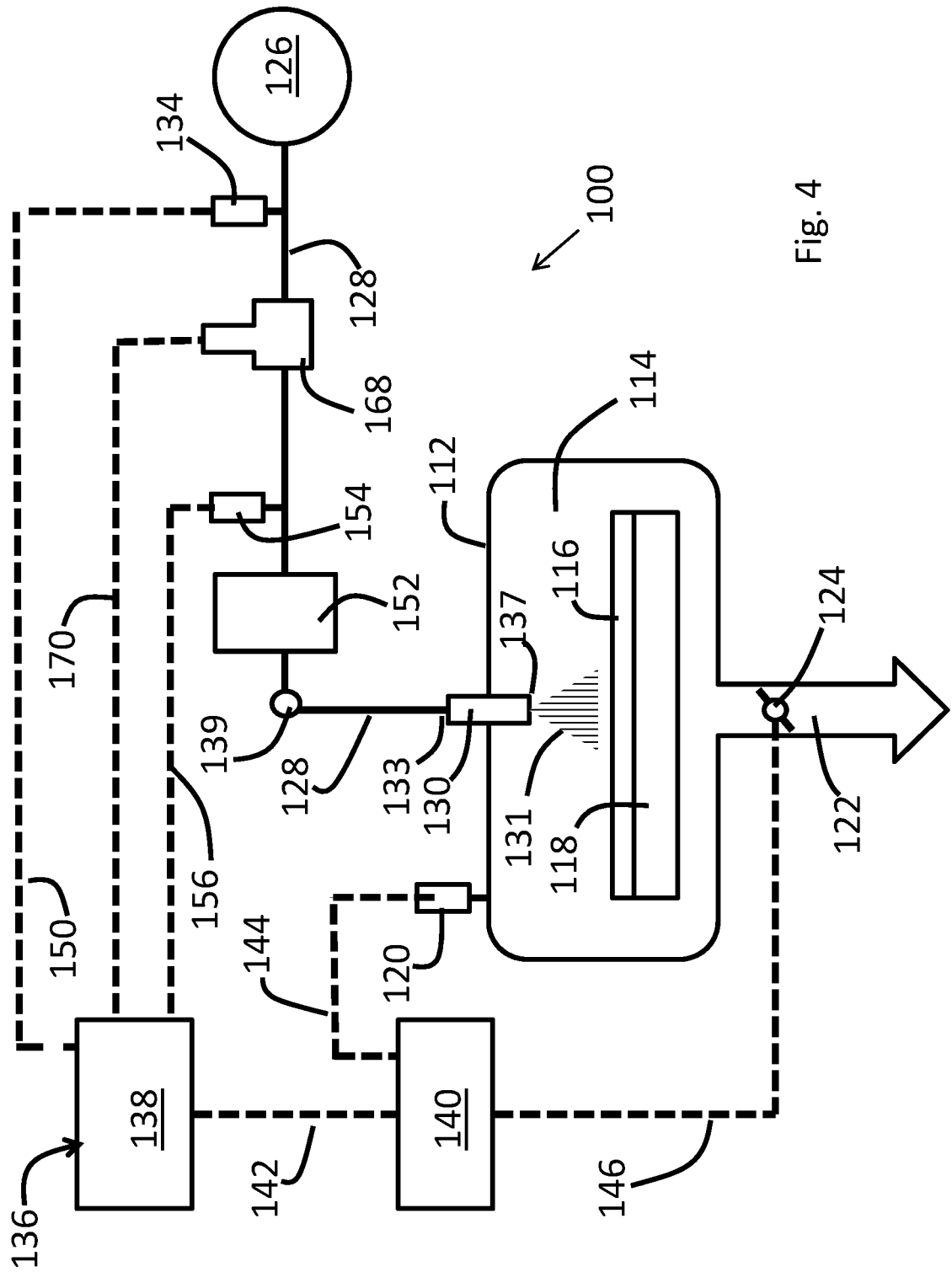
FIG. 4 schematically shows an alternative embodiment of a treatment system that uses pressure control strategies of the present invention.

Nested control loops sometimes can be problematic due to delays that can cause oscillations or generally non-optimal control in some instances. Accordingly, FIG. 4 shows an embodiment of a modification of system 100 by which pressure in the supply line 128 is controlled by a single control loop that directly varies flow rate responsive to pressure measurements made by pressure transducer 154. Use of a single control loop rather than nested control loops also allows the flow set point controller 158 to be removed from the system. As an additional difference, the MFC 132 of system 100 of FIG. 3 is replaced by gas control valve 168, which is connected to controller 138 by network communication line 170. Except for these differences and the use of a single control loop with respect to pressure transducer 154, system 100 in FIG. 5 otherwise is the same as system 100 in FIG. 3. Note that the optionally temperature communication lines 155 and 157 are not shown in FIG. 4 for purposes of clarity, but may be present in the system in order to help control temperature if desired. In FIG. 4, the control loops involving temperature control and chamber pressure control implemented in the same manner as is practiced for system 100 of FIG. 3.

Referring to FIG. 4, the variable flow control valve 168 desirably is in the form of a variable restriction valve, such as a needle valve, that is driven more open or more closed by a variable electric or pneumatic signal. The valve 168 preferably has a relatively linear response of flow rate as a function of the input signal to improve the overall control response. To apply a single loop control strategy to maintain the pressure in the supply line 128 at a desired pressure set point, pressure transducer 154 takes pressure readings of the pressurized fluid in line 128. Pressure transducer sends the readings to controller 138. For each pressure reading or for each composite pressure value derived from a plurality of individual pressure readings, controller 138 compares the measured pressure or composite value to a pressure set point stored in memory. Controller 138 uses the comparison to generate an error that indicates whether the measured pressure or composite pressure is too high or too low. Controller 138 uses a suitable control algorithm, such as PID control, to generate a control signal. The control signal indicates a change in flow rate needed to more closely match the measured pressure or composite pressure to the pressure set point. Controller 138 sends the control signal directly to the control valve 168 along line 170. The resultant actuation opens the valve 168 more if higher pressure is needed and closes the valve 168 more if less pressure is needed. In practical effect, pressure is controlled by varying the flow rate according to a theoretical or empirical relationship between the pressure error and the flow rate or flow rate adjustment needed to reduce the pressure error. Similarly to the nested control strategy of FIG. 3, the single loop control strategy of FIG. 4 also allows the flow rate to vary in a controlled manner in order to hold the pressure in supply line 128 constant. As a difference, the control loop of FIG. 4 eliminates a need to monitor flow rate. The flow control loop nested inside the pressure control loop also is eliminated by directly varying the flow control valve 168 in response to the pressure measurements taken by pressure transducer 154 and the deviation of those measurements from the desired pressure set point.

Figure 5:
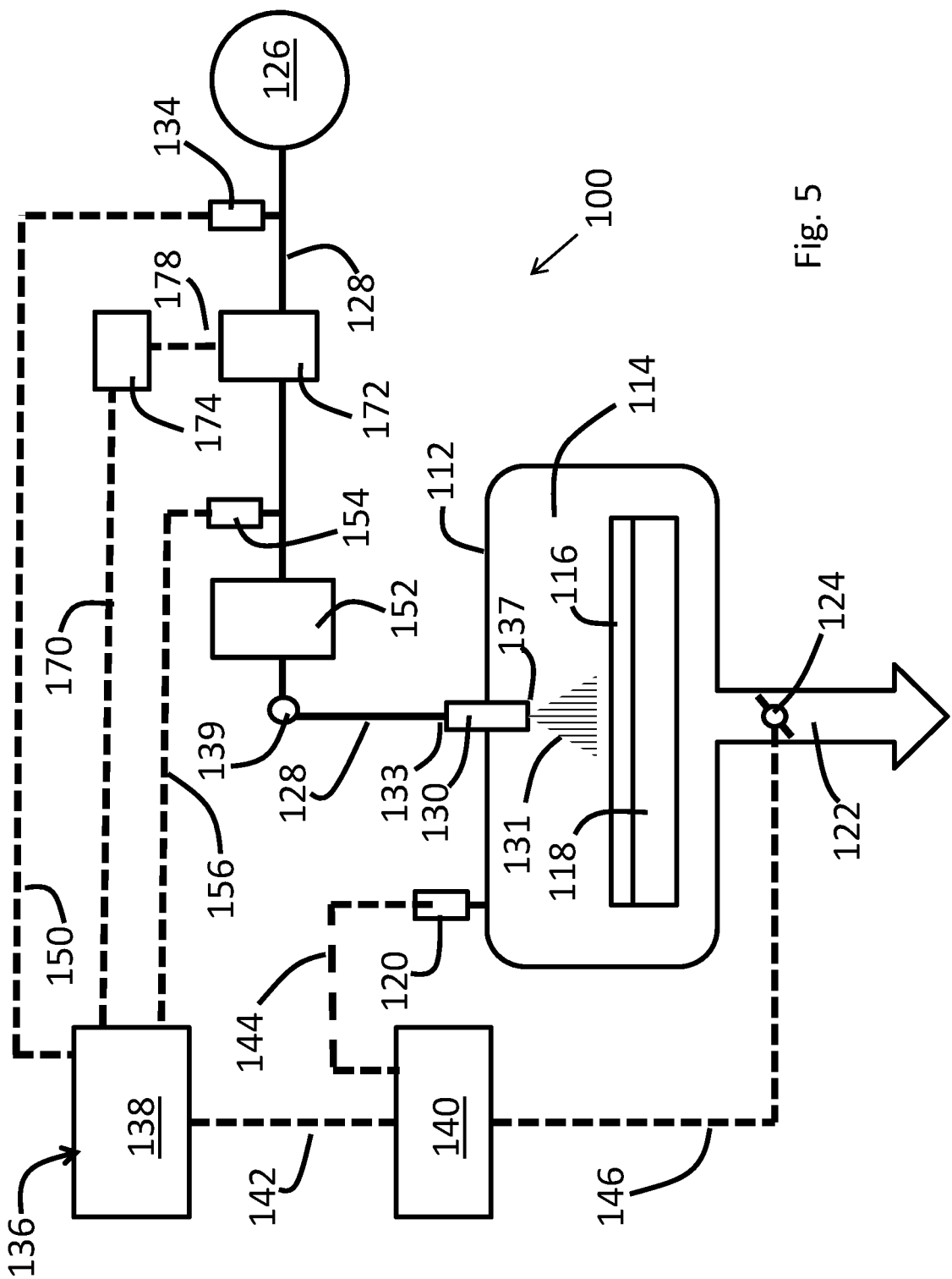
FIG. 5 schematically shows an alternative embodiment of a treatment system that uses pressure control strategies of the present invention.

FIG. 5 shows an alternative embodiment of the system of FIG. 4 in which the valve 168 is replaced by a dome-loaded pressure regulator 172, an electro-pneumatic ("E/P") transducer 174, and a network communication line 162 between the E/P transducer 174 and the dome-loaded regulator 172. Except for implementing a single control loop using these modified components, system 100 in FIG. 5 otherwise is identical to system 100 of FIG. 4. Note that the optional temperature communication lines 155 and 157 are not shown in FIG. 5 for purposes of clarity, but may be present in the system in order to help control temperature if desired. In FIG. 5, the control loops involving temperature control and chamber pressure control implemented in the same manner as is practiced for system 100 of FIG. 3.

Referring to FIG. 5, the pressure applied to the dome in the dome-loaded regulator 172 is supplied from the E/P transducer. A standard E/P transducer receives an analog electrical signal (e.g. 0-10 VDC or 4-20 mA) and outputs a corresponding pressure of Clean Dry Air (CDA) or other suitable pressurizing medium that is proportional to the incoming electrical signal. If such a standard E/P transducer is used, the control algorithm (such as a PID loop) may exist in the controller 138, in the E/P transducer 174 or in another suitable controller such as a solid state controller (not shown). For example, commercially available devices exist (e.g. such as those available from Tescom as used on the back pressure regulator on the dewar venting in TEL ANTARES™ tool available from TEL FSI, Chaska, Minn.) that include a PID algorithm within the E/P transducer device itself. This allows system 100 to incorporate a "smart" transducer that directly compares the pressure transducer readings from pressure transducer 154 to a set-point and adjusts the CDA pressure output accordingly to modulate the flow rate and thereby bring the pressure in supply line 128 to the desired set-point. For purposes of illustration, controller 138 incorporates the control algorithm.

In operation, pressure transducer 154 takes pressure readings of the fluid flowing in supply line 128. Pressure transducer 154 sends the pressure readings to controller 138 via network communication line 156. For each reading or for a composite of a plurality of readings, controller 138 compares the reading or composite value to a desired pressure set point. Controller 138 uses the comparison to generate an error to indicate of the pressure reading or composite reading is too high or too low. Controller 138 generates a corresponding control signal and sends the signal to the E/P transducer 174. The E/P transducer is actuated to adjust the CDA pressure output accordingly. This in turn actuates valve 172 to adjust the flow rate to help reduce the pressure error. Again, this strategy allows the flow rate to vary in a controlled manner in order to hold the pressure in supply line 128 constant.

All patents, patent applications, and publications cited herein are incorporated by reference in their respective entireties for all purposes. The foregoing detailed description has been given for clarity of understanding only. No unnecessary limitations are to be understood therefrom. The invention is not limited to the exact details shown and described, for variations obvious to one skilled in the art will be included within the invention defined by the claims.

What is claimed is:

1. A method of treating a substrate, comprising the steps of:
 a) providing a microelectronic substrate in a vacuum process chamber, wherein the vacuum process chamber has a controlled vacuum pressure;
 b) supplying an incoming pressurized fluid to a flow restriction device, wherein the incoming pressurized fluid has a controllable pressure;
 c) using the flow restriction device to dispense the incoming pressurized fluid into the vacuum process chamber as a stream such that the stream impacts the microelectronic substrate;
 d) obtaining pressure readings of the incoming pressurized fluid; and
 e) adjusting the flow rate of the incoming pressurized fluid as a function of the pressure readings in a manner effecting to maintain the incoming pressurized fluid as supplied to the flow restriction device at a controlled pressure.

2. The method of claim 1, wherein the flow restriction device comprises a flow restriction device inlet that receives the incoming pressurized fluid, a flow restriction device outlet through which the incoming pressurized fluid is dispensed into the vacuum process chamber, and a restriction orifice between the flow restriction device inlet and the flow restriction device outlet.

3. The method of claim 1, wherein step e) comprises the steps of:
 i) measuring a pressure characteristic of the incoming pressurized fluid supplied to the flow restriction device;
 ii) using the measured pressure characteristic to generate a current flow rate setpoint indicative of a flow rate effective to help correct an error between the measured pressure characteristic and a pressure setpoint; and
 iii) using the flow rate setpoint to control the flow rate of the incoming pressurized fluid, said flow rate adjustment helping to maintain the incoming pressurized fluid at the controlled pressure.

4. A method of treating a substrate, comprising the steps of:
 a) providing a microelectronic substrate in a vacuum process chamber, wherein the vacuum process chamber has a controlled vacuum pressure;
 b) supplying an incoming pressurized fluid to a flow restriction device, wherein the incoming pressurized fluid has a controllable pressure;
 c) using the flow restriction device to dispense the incoming pressurized fluid into the vacuum process chamber as a stream such that the stream impacts the microelectronic substrate;
 d) providing a pressure signal that is indicative of an incoming pressure of the incoming, pressurized fluid supplied to the flow restriction device;
 e) providing a setpoint pressure indicative of a desired incoming pressure of the incoming pressurized fluid supplied to the flow restriction device;
 f) determining a control signal based at least in part on a comparison of the incoming pressure signal and the setpoint pressure, said control signal being an indication of a difference between the incoming pressure signal and the setpoint pressure; and
 g) using the control signal to adjust the flow rate of the incoming pressurized fluid to help control the pressurized incoming fluid at the desired pressure setpoint.

5. The method of claim 4, wherein the flow restriction device comprises a fluid expansion nozzle comprising:
 an inlet that receives the incoming pressurized fluid, said inlet having an inlet diameter between 0.1 mm and 4 mm;

an outlet through which the incoming pressurized fluid is dispensed into the process chamber, said outlet having an outlet diameter in the range from 0.1 mm to 6 mm; and a throat between the inlet and the outlet, said throat having a throat diameter between 0.1 mm and 4 mm.

6. The method of claim 4, wherein the flow restriction device comprises a fluid expansion nozzle comprising:

an inlet that receives the incoming pressurized fluid, said inlet having an inlet diameter between 0.1 mm and 4 mm; and an outlet through which the incoming pressurized fluid is dispensed into the process chamber, said outlet having an outlet diameter in the range from 0.1 mm to 6 mm.

7. The method of claim 4, wherein step g) comprises using a mass flow controller to adjust the incoming pressure based, at least in part, on a difference between the incoming pressure signal and the setpoint pressure.

8. The method of claim 4, wherein step g) comprises using a flow control device that is adjusted by a process controller in order to control the incoming pressure based, at least in part, on a difference between the incoming pressure signal and the setpoint pressure wherein the flow control device is selected from the group consisting of a needle valve, a pinch valve, a diaphragm valve, and/or a variable control valve.

9. The method of claim 4, wherein step g) comprising using a flow control device that is controlled by a process controller to adjust the incoming pressure based, at least in part, on a difference between the incoming pressure signal and the setpoint pressure, said flow control device being selected from the group consisting of a variable electric valve or a variable pneumatic valve.

10. The method of claim 4, wherein step g) comprises using a flow control device that is controlled by a process controller to adjust the incoming pressure based, at least in part, on a difference between the incoming pressure signal and the setpoint pressure, said flow control device comprising a dome-loaded pressure regulator, wherein the dome-loaded pressure regulator is controlled by a pneumatic gas pressure applied to the dome-loaded pressure regulator.

11. The method of claim 10, wherein the dome-loaded pressure regulator is electrically coupled to the process controller via an electro-pneumatic transducer.

12. The method of claim 11, further comprising adjusting the pneumatic gas pressure that is applied to the dome-loaded pressure regulator to control pressure of the incoming pressurized fluid based, at least in part, on a difference between the incoming pressure signal and the pressure setpoint.

13. The method of claim 4, wherein step b) comprises using a supply line to supply the incoming pressurized fluid to the flow restriction device, wherein a controllable flow restriction device is disposed on the supply line in a manner effective to help control the flow rate of the incoming pressurized fluid and wherein a cooling system is disposed on the supply line in a manner effective to cool the incoming pressurized fluid, said cooling system being disposed on the supply line between the flow control device and the flow restriction device.

14. The method of claim 4, wherein step b) comprises cooling the pressurized incoming fluid to a temperature in the range from 77 K to 110 K.

15. The method of claim 4, wherein step b) comprises heating the pressurized incoming fluid to a temperature in the range from 300 K to 350 K.

16. The method of claim 4, wherein the incoming pressurized fluid is selected from the group consisting of argon, nitrogen, hydrogen, xenon, krypton, CO2, He, or a combination thereof.

17. The method of claim 4, wherein the stream includes an aerosol spray.

18. The method of claim 4, wherein the stream comprises a gas cluster jet.

19. The method of claim 18, wherein step c) comprises removing objects, particles, and/or contaminants from the substrate using the gas cluster jet.

20. The method of claim 4, step f) comprises using a PID control algorithm to determine the control signal.

21. The method of claim 4, wherein step b) comprises heating the incoming pressurized fluid.

22. The method of claim 21, wherein step b) comprises heating the incoming pressurized fluid to a temperature in the range from 300 K to 325K.

* * * * *